United States Patent
Shibasaki

(10) Patent No.: US 8,444,276 B2
(45) Date of Patent: May 21, 2013

(54) LIGHT SOURCE DEVICE, PROJECTION APPARATUS INCLUDING THE LIGHT SOURCE DEVICE, AND PROJECTION METHOD

(75) Inventor: Mamoru Shibasaki, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 237 days.

(21) Appl. No.: 12/894,448

(22) Filed: Sep. 30, 2010

(65) Prior Publication Data

US 2011/0075106 A1 Mar. 31, 2011

(30) Foreign Application Priority Data

Sep. 30, 2009 (JP) ................................. 2009-228599

(51) Int. Cl.
G03B 21/20 (2006.01)
(52) U.S. Cl.
USPC .................. 353/85; 353/31; 353/94; 353/98; 353/99; 353/122; 362/227; 362/231; 372/29.01
(58) Field of Classification Search .................... 353/31, 353/85, 94, 98, 99, 122; 372/20, 29.01, 32; 345/102, 345/691; 362/227, 231, 235, 236, 240, 246, 362/250, 251
See application file for complete search history.

(56) References Cited

U.S. PATENT DOCUMENTS

| | | | | |
|---|---|---|---|---|
| 5,793,786 A * | 8/1998 | Furumiya | ................... | 372/38.02 |
| 5,971,545 A * | 10/1999 | Haitz | ............................... | 353/31 |
| 6,817,723 B1 * | 11/2004 | May | ................................. | 353/85 |
| 7,052,138 B2 * | 5/2006 | Matsui | ............................. | 353/31 |
| 7,347,557 B2 * | 3/2008 | De Smet | .......................... | 353/20 |
| 7,570,404 B2 * | 8/2009 | Li et al. | ........................... | 359/15 |
| 8,021,001 B2 * | 9/2011 | Iwanaga | ........................... | 353/85 |
| 2001/0053078 A1 * | 12/2001 | Ishikawa et al. | ............... | 362/238 |
| 2004/0041824 A1 * | 3/2004 | Willis | ............................ | 345/691 |
| 2006/0290625 A1 * | 12/2006 | Sugimoto | ......................... | 345/83 |
| 2007/0132706 A1 * | 6/2007 | Nishimura et al. | ........... | 345/102 |
| 2008/0013314 A1 * | 1/2008 | Ashdown et al. | .............. | 362/231 |
| 2008/0310002 A1 | 12/2008 | Shikita et al. | | |
| 2010/0097412 A1 * | 4/2010 | Okabe | ........................... | 345/691 |

FOREIGN PATENT DOCUMENTS

| | | |
|---|---|---|
| JP | 2005-331705 A | 12/2005 |
| JP | 2007-25466 A | 2/2007 |
| JP | 2008-304726 A | 12/2008 |

OTHER PUBLICATIONS

Japanese Office Action dated Nov. 20, 2012 (and English translation thereof) in counterpart Japanese Application No. 2009-228599.

* cited by examiner

Primary Examiner — Georgia Y Epps
Assistant Examiner — Sultan Chowdhury
(74) Attorney, Agent, or Firm — Holtz, Holtz, Goodman & Chick, PC

(57) ABSTRACT

A light source device includes: a light source section which comprises plural laser diodes; a pulse driving section which divides the laser diodes of the light source section into plural groups, each group having the same number of the laser diodes, and drives the laser diodes of the each group by a pulse having a predetermined period and a predetermined duty ratio; and a light source driving section which controls a phase of the pulse for the each group so that the same number of the laser diodes are emitted in succession when the laser diodes of the each group are driven by the pulse driving section.

17 Claims, 4 Drawing Sheets

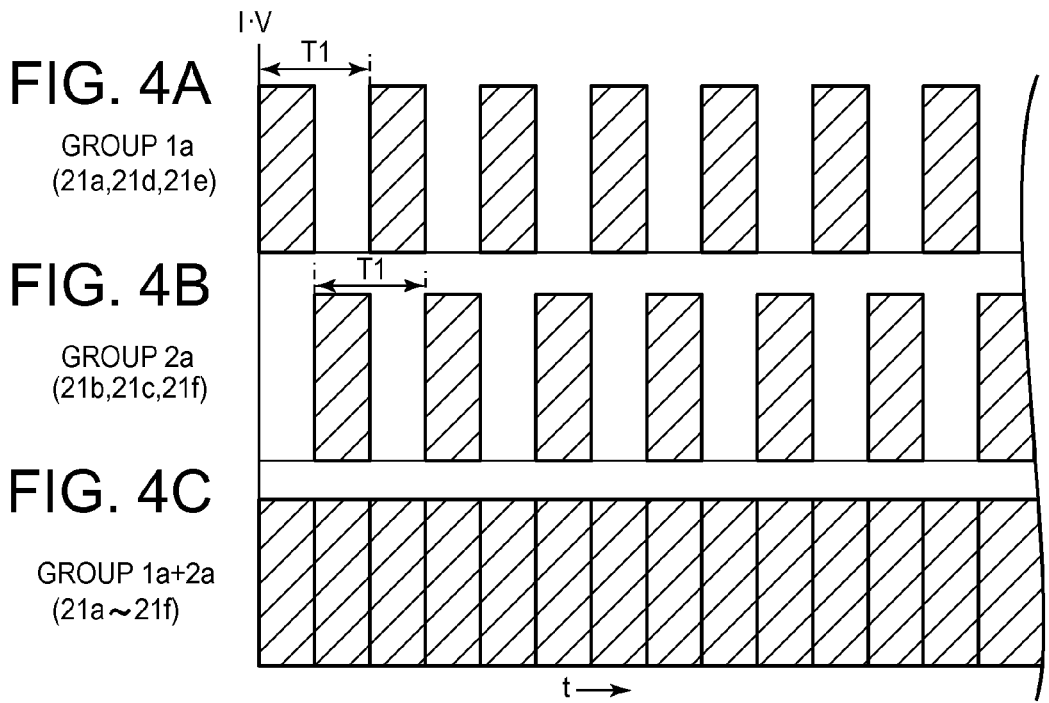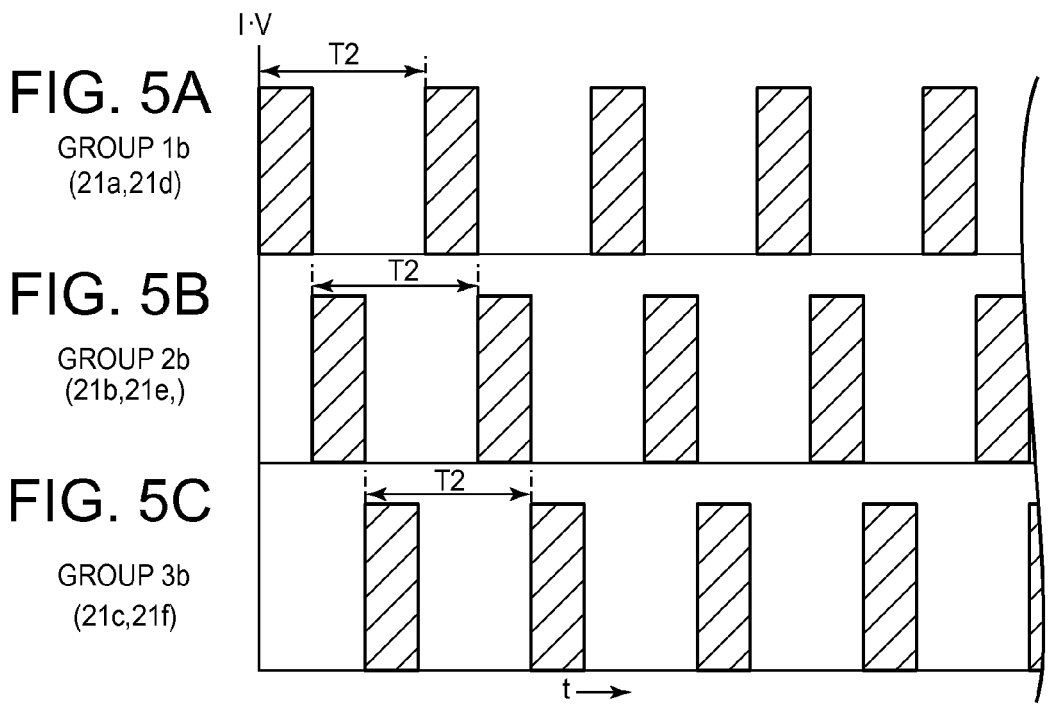

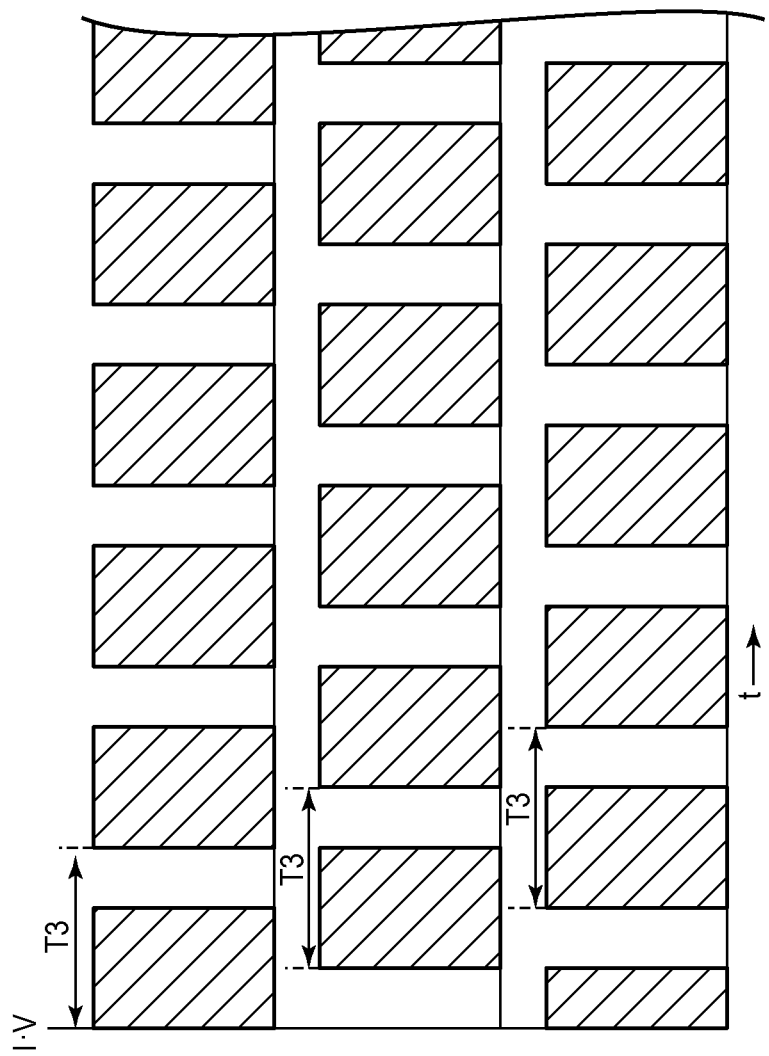

LIGHT SOURCE DEVICE, PROJECTION APPARATUS INCLUDING THE LIGHT SOURCE DEVICE, AND PROJECTION METHOD

CROSS-REFERENCE TO RELATED APPLICATIONS

This application is based upon and claims the benefit of priority from Japanese Patent Application No. 2009-228599, filed Sep. 30, 2009, the entire contents of which are incorporated herein by reference.

BACKGROUND OF THE INVENTION

1. Field of the Invention

The present invention relates to a light source device including a laser light source used well for a projector, projector apparatus including the light source device and projection method.

2. Description of the Related Art

A rear projector using a laser light as a light source, which includes (a) a light source for emitting laser light toward a screen, (b) a scanning means for scanning a laser light emitted by the light source, (c) diffusing means for diffusing the laser light scanned by the scanning means and (d) focusing means for focusing the laser light diffused by the diffusing means on a screen, has been disclosed in Japanese Patent Application Publication No. 2007-025466 to reduce the speckle noise occurred on a screen.

By the way, laser diodes generally used as a light source for emitting laser light do not oscillate until the current value supplied to the laser diodes increases to the threshold current value. When the current value supplied to the laser diodes is larger than the threshold current value, the laser diodes oscillates linearly.

Therefore, higher emission efficiency is obtained when the laser diodes is driven by a bigger current value within operating limit current value of the laser diodes.

Thus, it is more efficient to drive the laser diodes intermittently by double current value and 50% duty ratio than to drive the laser diodes by a constant current value to get the same electrical output power in a unit time.

Nevertheless, as shown in the above Patent Document, it is required that the light source continues emitting in a constant output if the laser diodes are used as the light source of the projector.

Therefore it was impossible to employ the intermittent driving mentioned above, and as a result the light source had to be driven in lower emission efficiency.

The present invention has been made in view of the foregoing problems of conventional technology. It is accordingly an object of the present invention to provide a light source unit, projector apparatus, and projection method, which can drive laser diodes with higher emission efficiency and obtain a constant luminance in succession.

BRIEF SUMMARY OF THE INVENTION

According to one aspect of the present invention, there is provided a light source device comprising: a light source section which comprises plural laser diodes; a pulse driving section which divides the laser diodes of the light source section into plural groups, each group having the same number of the laser diodes, and drives the laser diodes of the each group by a pulse having a predetermined period and a predetermined duty ratio; and a light source driving section which controls a phase of the pulse for the each group so that the same number of the laser diodes are emitted in succession when the laser diodes of the each group are driven by the pulse driving section.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a timing chart illustrating a light emission timing of a light source section according to the first embodiment;

FIG. 5 is a timing chart illustrating a light emission timing of a light source section according to the second embodiment; and FIG. 6 is a timing chart illustrating a light emission timing of a light source section according to the third embodiment.

DETAILED DESCRIPTION OF THE INVENTION

Figure 1:
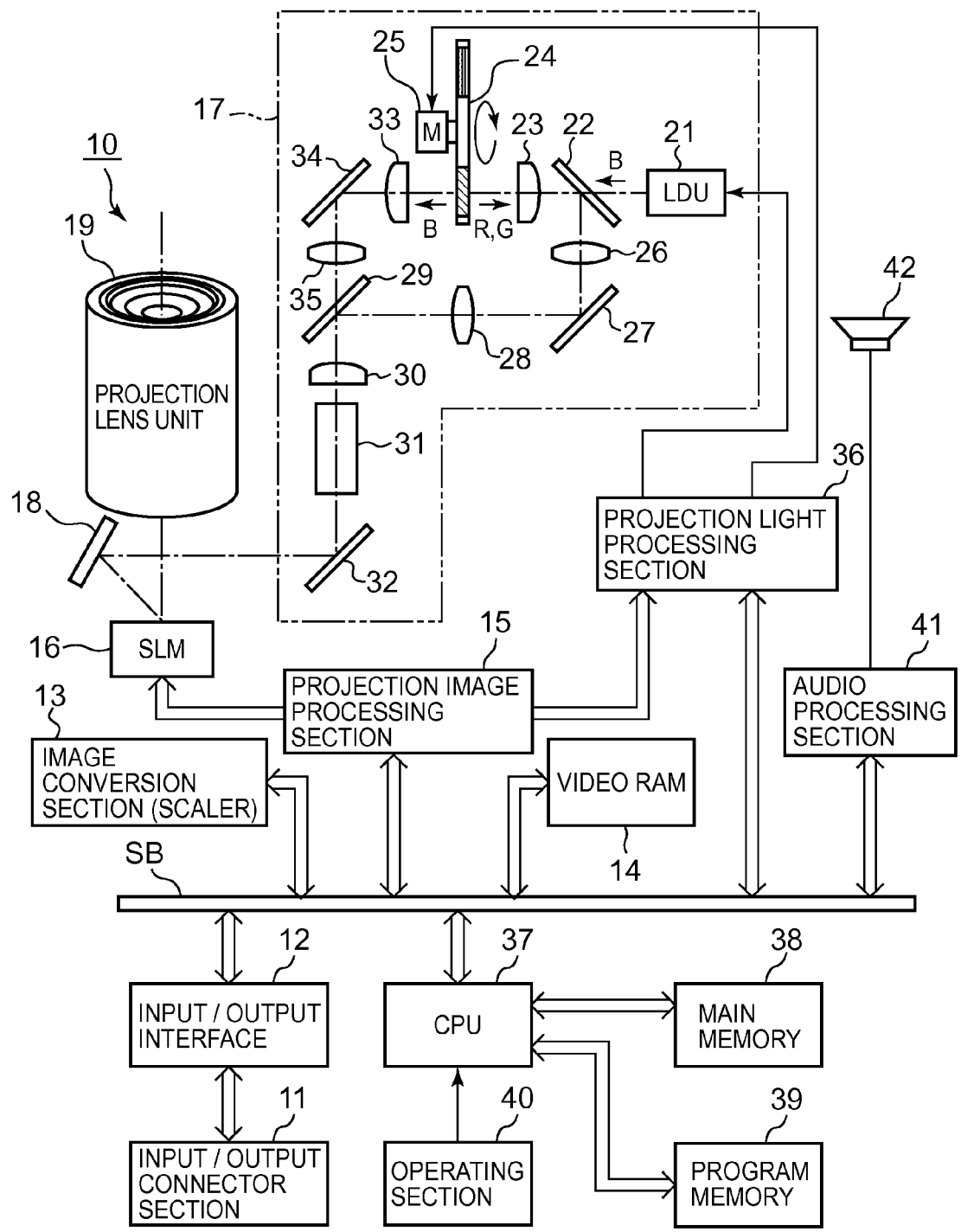
FIG. 1 is a block diagram illustrating the overall configuration of the function of a circuit provided for a data projector apparatus according to one embodiment of the present embodiment.

Preferred embodiments of the present invention will now be described with reference to the drawings. In the embodiments described below, various technically preferred limits are set for carrying out the invention, but the scope of the invention is not limited to the following embodiments or examples shown in the drawings.

Using an example where the present invention is applied to a Digital Light Processing (DLP [registered mark]) data projector apparatus, the present invention will be described with reference to the drawings.

FIG. 1 is a block diagram schematically illustrating the configuration of the function of an electronic circuit included in a data projector apparatus 10 according to the present embodiment.

An input/output connector section 11 includes, for example, an RCA [Radio Corporation of America] pin jack video input terminal, D-sub 15 RGB input terminal, and Universal Serial Bus (USB) connector.

Image signals of various specifications input from the input/output connector section 11 are input to an image conversion section 13 (generally called a scaler) via an input/output interface 12 and a system bus SB.

The image conversion section 13 converts the input image signals into uniform image signals of predetermined format suitable for projection, then stores these image signals in a video RAM 14 (i.e., a buffer memory for display) as needed, and transmits them to a projection image processing section 15.

At this time, data such as symbols representing various operating conditions for on-screen display (OSD) are superposed on the image signals by the video RAM 14 if necessary, and the image signals thus processed are transmitted to the projection image processing section 15.

According to the transmitted signals, the projection image processing section 15 drives and displays a micromirror element 16 (i.e., spatial light modulation [SLM] element) through a higher-speed time division drive determined by multiplying the frame rate (which is based on a predetermined format), for example, 60 frames/sec, the number of components into which color is divided, and gradation for display.

The micromirror element 16 individually on/off operates the angles of inclination of a plurality of minute mirrors at high speed. The minute mirrors provided for, for example, extended graphics array (XGA) (1024 horizontal pixels×768 vertical pixels) are arranged in an array. Thereby the micromirror element 16 forms an optical image with light reflected by the micromirrors.

Meanwhile, a light source section 17 emits red (R), green (G), and blue (B) primary color components in a circulatory and time-division manner. The primary color components from the light source section 17 are reflected by a mirror 18 and the micromirror element 16 is thereby illuminated by the light components.

Then, an optical image is formed with the light components reflected by the micromirror element 16. The optical image thus formed is projected and displayed on a screen (not shown), which is a projection target, via a lens unit 19.

The light source section 17 comprises a laser diode unit (LDU) 21 having plural laser diodes, each laser diode emitting blue laser light of a same wavelength.

Figure 2:
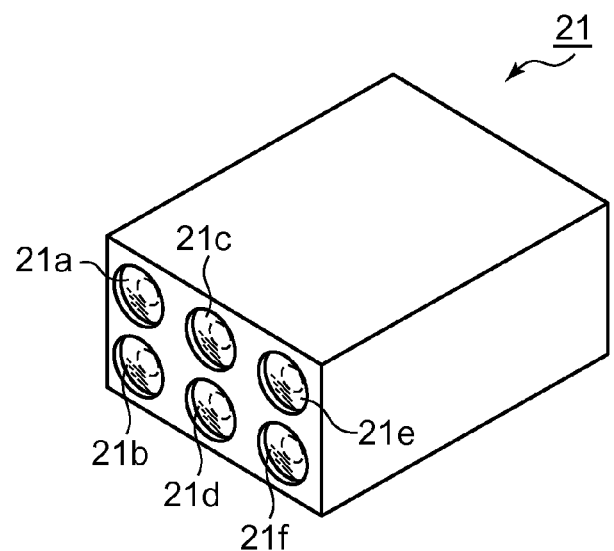
FIG. 2 is an oblique perspective figure illustrating the outline view of a laser diode unit according to the embodiment.

FIG. 2 mainly illustrates an example of the detailed configuration of the LDU 21. As shown in FIG. 2, the LDU 21 comprises six laser diodes 21a to 21f. These total six laser diodes 21a to 21f, which are arranged in 2 times 3 layout, use one-colored laser diodes having the same emission property and emission direction each other. In this embodiment, these laser diodes 21a to 21f emit blue laser light.

The blue laser light emitted by the LDU 21 transmits through a dichroic mirror 22 and converges on one point of the circumference of a rotating wheel 24 via a lens 23.

A motor 25 rotates the rotating wheel 24. On the circumference of the rotating wheel 24 illuminated by the blue laser light, a red phosphor reflective plate 24R, a green phosphor reflective plate 24G and a diffusing plate 24B are combined in the shape of a ring.

Figure 3:
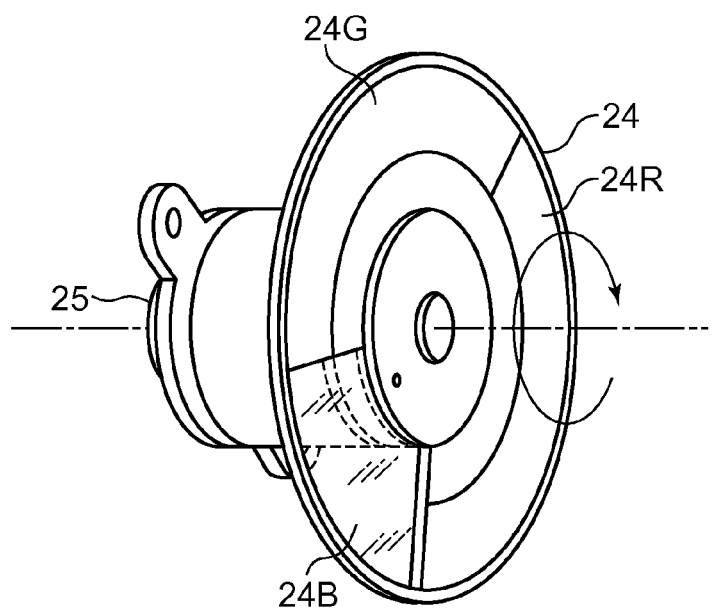
FIG. 3 is an oblique perspective figure illustrating the outline view of a rotating wheel and a motor according to the embodiment.

FIG. 3 is a perspective view of the external configuration of the rotating wheel 24 and the motor 25. As shown in FIG. 3, the red phosphor reflective plate 24R emits the red light reflectively to the incident direction of the blue laser light by having a mirror structure arranged on an opposite surface of a surface to which the blue laser light is illuminated directly and exciting the red light on the applied phosphor surface with the blue laser light illuminating.

Similarly, the green phosphor reflective plate 24G emits the green light reflectively to the incident direction of the blue laser light by having a mirror structure arranged on an opposite surface of a surface to which the blue laser light is illuminated directly and exciting the green light on the applied phosphor surface with the blue laser light illuminating.

The diffusing plate 24B comprises a transmission material such as a frosted glass. Then, the diffusing plate 24B diffuses and transmits the blue laser light illuminated by the LDU 21.

When the red phosphor reflective plate 24R of the rotating wheel 24 is in a place illuminated by the blue laser light, the red light is excited by illumination with the blue laser light. The excited red light is reflected by the rotating wheel 24, and is also reflected by the dichroic mirror 22 via a lens 23.

Thereafter, this red light is reflected by a mirror 27 via a lens 26, and is also reflected by another dichroic mirror 29 via a lens 28. Then, this red light is formed into a luminous flux of substantially uniformly distributed luminance by an integrator 31 via a lens 30. Then, the luminous flux is reflected by a mirror 32 and transmitted to the mirror 18.

When the green phosphor reflective plate 24G of the rotating wheel 24 is in a place illuminated by the blue laser light, the green light is excited by illumination with the blue laser light. The excited green light is reflected by the rotating wheel 24, and is also reflected by the dichroic mirror 22 via a lens 23.

Thereafter, this green light is reflected by a mirror 27 via a lens 26, and is also reflected by another dichroic mirror 29 via a lens 28. Then, this green light is formed into a luminous flux of substantially uniformly distributed luminance by an integrator 31 via a lens 30. Then, the luminous flux is reflected by a mirror 32 and transmitted to the mirror 18.

When the diffusing plate 24B is located in a place illuminated by the blue laser light, the blue laser light is passed through the rotating wheel 24 while being diffused by the diffusing plate 24B, and is then reflected by mirrors 34 via a lens 33. Thereafter, this blue light is transmitted through the dichroic mirror 29 via a lens 35 and formed into a luminous flux of substantially uniformly distributed luminance by the integrator 31 via a lens 30. Then, the luminous flux is reflected by the mirror 32 and transmitted to the mirror 18.

As describe above, the dichroic mirror 22 and 29 transmit a blue light with wavelength band and reflect a red light and a green light with wavelength band.

A projection light processing section 36 wholly controls the light emission timings of the LDU 21 in the light source section 17, and the rotation of the rotating wheel 24 by the motor 25. According to the timing of image data provided by the projection image processing section 15, the projection light processing section 36 controls the light emission timings of the LDU 21 in the light source section 17, and the rotation of the rotating wheel 24.

A CPU 37 controls operation of all the circuits. This CPU 37 connects to a main memory 38 and a program memory 39 directly. The main memory 38 comprising a DRAM operates as a working memory of the CPU 37. The program memory 39 comprises an electrically writable non-volatile memory that stores operating programs and various fixed data, etc operated by CPU 37. The CPU 37 uses the main memory 38 and the program memory 39 to control operations inside the data projector apparatus 10.

The CPU 37 performs various projection operations according to key operating signals output from an operating section 40.

The operating section 40 includes a key operating section provided on the main body of the data projector apparatus 10 and a laser receiving section that receives infrared light from a remote controller, not shown, specially provided for the data projector apparatus 10. A key operating signal based on a key operated by a user through the key operating section of the main body or through the remote controller is directly output to the CPU 37 by the operating section 40.

Further, the CPU 37 is connected to an audio processing section 41 via the system bus SB. The audio processing section 41 comprises a pulse code modulation (PCM) audio source circuit. The audio processing section 41 analogizes audio data provided for a projection operation, drives a loudspeaker 42 to intensify and emit audio, or produces a beep if necessary.

Next, the operation of the embodiment will be described.

FIG. 4 illustrates first example of the emission timing of a blue laser light by the LDU 21. In this first embodiment, six laser diodes 21a to 21f in the LDU 21 are divided into two groups such as a first group 1a including laser diodes 21a, 21d and 21e, and a second group 2a including laser diodes 21b, 21c and 21f. In FIG. 4, the horizontal axis shows time t and the vertical axis shows the electrical power of driving (I·V).

As described above, these driving operations are executed by the control of the projection light processing section 36, and each of the laser diodes 21a to 21f is driven by current bigger than the threshold current value while oscillating.

FIG. 4A illustrates the emission timing of the group 1a including laser diodes 21a, 21d and 21e.

FIG. 4B illustrates the emission timing of the group 2a including laser diodes 21b, 21c, and 21f.

As shown in FIG. 4A and FIG. 4B, the groups 1a and 2a are configured to oscillate by a pulse having the same period T1 and the same duty ratio 50% with each of the phases shifted in 180° (=T1/2).

FIG. 4C illustrates the emission timing of both of the groups 1a and 2a including all laser diodes 21a to 21f. As shown in FIG. 4C, seeing the entire LDU 21 as a whole, the laser lights are continuously emitted from oscillated three laser diodes one after the other on a constant basis by complementing the intermittent term between the groups 1a and 2a.

With this structure described above, in the instance where the groups 1a and 2a are pulse-driven by the electrical power 2×, higher luminance can be obtained by virtue of being able to drive each of the laser diodes with high efficiency compared to the luminance obtained in the instance where the six laser diodes 21a~21f are driven by the predetermined electrical power×simultaneously, despite the total electrical power for driving is equal.

Or in case that it is demanded to obtain the same luminance as luminance obtained by simultaneously light-emitting the six laser diodes 21a to 21f, the total electrical power for driving can be reduced by driving each of the groups 1a and 2a with smaller electrical power than the double electrical power of the electrical power for simultaneously light-emitting the six laser diodes 21a to 21f.

Therefore, the source light, which has stable light quantity in succession and is emitted in high efficiency, via the rotating wheel 24 is provided to the micromirror element 16 which forms the optical image on the screen.

FIG. 5 illustrates second example of the emission timing of a blue laser light by the LDU 21. In this second embodiment, six laser diodes 21a to 21f in the LDU 21 are divided into three groups such as a first group 1b including laser diodes 21a and 21d, a second group 2b including laser diodes 21b and 21e, and a third group 3b including laser diodes 21c and 21f. In FIG. 5, the horizontal axis shows time t and the vertical axis shows the electrical power of driving (I·V).

As described above, these driving operations are executed by the control of the projection light processing section 36, and each of the laser diodes 21a to 21f is driven by current bigger than the threshold current value while oscillating.

FIG. 5A illustrates the emission timing of the group 1b including a laser diodes 21a and 21d.

FIG. 5B illustrates the emission timing of the group 2b including a laser diodes 21b and 21e.

FIG. 5C illustrates the emission timing of the group 3b including a laser diodes 21c and 21f.

As shown in FIG. 5A to FIG. 5C, the groups 1b to 3b are configured to oscillate by a pulse having the same period T2 and the same duty ratio 33.3% with each of the phases shifted in 120° (=T2/3).

As shown in FIG. 5, seeing the entire LDU 21 as a whole, the laser lights are continuously emitted from oscillated two laser diodes one after the other on a constant basis by complementing the intermittent term between the groups 1b to 3b.

With this structure described above, in the instance where the groups 1b to 3b are pulse-driven by the electrical power 3×, higher luminance can be obtained by virtue of being able to drive each of the laser diodes with high efficiency compared to the luminance obtained in the instance where the six laser diodes 21a~21f are driven by the predetermined electrical power×simultaneously, despite the total electrical power for driving is equal.

Or in case that it is demanded to obtain the same luminance as luminance obtained by simultaneously light-emitting the six laser diodes 21a to 21f, the total electrical power for driving can be reduced by driving each of the groups 1b to 3b with smaller electrical power than the triple electrical power of the electrical power for simultaneously light-emitting the six laser diodes 21a to 21f.

FIG. 6 illustrates third example of the emission timing of a blue laser light by the LDU 21. In this third embodiment, six laser diodes 21a to 21f in the LDU 21 are divided into three groups such as a first group 1c including laser diodes 21a and 21d, a second group 2c including laser diodes 21b and 21e, and a third group 3c including laser diodes 21c and 21f. In FIG. 6, the horizontal axis shows time t and the vertical axis shows the electrical power of driving (I·V).

As described above, these driving operations are executed by the control of the projection light processing section 36, and each of the laser diodes 21a to 21f is driven by current bigger than the threshold current value while oscillating.

FIG. 6A illustrates the emission timing of the group 1c including a laser diodes 21a and 21d.

FIG. 6B illustrates the emission timing of the group 2c including a laser diodes 21b and 21e.

FIG. 6C illustrates the emission timing of the group 3c including a laser diodes 21c and 21f.

As shown in FIG. 6A to FIG. 6C, the groups 1c to 3c are configured to oscillate by a pulse having the same period T3 and the same duty ratio 66.7% with each of the phases shifted in 120° (=T3/3).

As shown in FIG. 6, seeing the entire LDU 21 as a whole, the laser lights are continuously emitted from oscillated four laser diodes one after the other on a constant basis by complementing the intermittent term between the groups 1c to 3c.

With this structure described above, in the instance where the groups 1c to 3c are pulse-driven by the electrical power 1.5×, higher luminance can be obtained by virtue of being able to drive each of the laser diodes with high efficiency compared to the luminance obtained in the instance where the six laser diodes 21a~21f are driven by the predetermined electrical power×simultaneously, despite the total electrical power for driving is equal.

Or in case that it is demanded to obtain the same luminance as luminance obtained by simultaneously light-emitting the six laser diodes 21a to 21f, the total electrical power for driving can be reduced by driving each of the groups 1c to 3c with smaller electrical power than the sesquialteral electrical power of the electrical power for simultaneously light-emitting the six laser diodes 21a to 21f.

As described above, this third embodiment shown in FIG. 6 is effective to avoid such problem that the driving current value of each of the laser diodes in the LDU 21 exceeds the operating limit current value of the laser diode assuming that the laser diodes of the LDU 21 are divided into more groups than shown in FIGS. 4 and 5.

As described in the first embodiment and the second embodiment, the electrical power for driving of one group, which is proportional to the driving current value of the each laser diode, is increased by dividing the LDU 21 into more groups and reducing the number of the laser diodes driven at the same time. As a result, it is possible to drive the LDU 21 with higher emission efficiency.

But the emission efficiency is reduced rapidly as the driving current value of the laser diode increases beyond the operating limit current value of the laser diode of the LDU 21.

Therefore, in this third embodiment, it is possible to prevent the reduction of the emission efficiency by increasing the duty ratio of the pulse in each group and increasing the number of the laser diodes driven at the same time.

As described in any of the above embodiments, it is enabled to reduce the load of the data projector apparatus 10 for cooling the light source section 17 and to downsize the apparatus, by the intermittent driving of the laser diodes 21a to 21f that constitute the LDU 21.

In addition, it is possible to prolong the life-time of the laser diodes 21a to 21f that constitute the LDU 21 by the intermittent driving described above, since the life-time of laser diodes is determined by the oscillation time and the temperature of the laser diode.

As described in the above embodiments, it is enabled to drive the laser diodes 21a to 21f of the light source section 17 with higher emission efficiency and obtain a constant high luminance in succession.

And in the above embodiments, the laser diodes 21a to 21f that constitute the LDU 21 are divided into plural groups each having a plurality of laser diodes, and are controlled on a group-by-group basis.

Therefore, by driving the laser diodes on a group-by-group basis, it is achieved to obtain a constant high luminance in succession and simplify the control process in the projection light processing section 36 for driving the LDU 21, by virtue of averaging the laser diodes which have considerable individual variability of the oscillation output and reducing the individual variability.

In the foregoing embodiments, a description has been given using the LDU 21 which has six laser diodes 21a to 21f as the light source section 17.

However, the present invention is not limited to what described in the above embodiments. For example, this present invention can be applied to another kind of a light source which comprises another type of lighting element, such as LEDs, with laser diodes.

The description given above is an example where the present invention is applied to a DLP (registered trademark) data projector apparatus. However, the present invention can equally be applied to, for instance, a liquid crystal projector that forms an optical image by using a transmission-type monochrome liquid crystal panel.

For example, even when some of the constituent elements of the configurations of the embodiments described above are omitted, this modified configuration is included in the present invention as long as the same effect can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light source device comprising:
   a light source section which comprises plural laser diodes;
   a pulse driving section which divides the laser diodes of the light source section into plural groups, each group having the same number of the laser diodes, and drives the laser diodes of each said group by a pulse having a predetermined period and a predetermined duty ratio; and
   a light source driving section which controls a phase of the pulse for each said group so that pulses corresponding to different groups are phase-shifted with respect to each other, and so that the same number of the laser diodes, which is less than a total number of the laser diodes, emit light in succession when the laser diodes in the plurality of groups are driven by the pulse driving section.

2. The light source device according to claim 1, wherein the pulse driving section drives each laser diode in a given one of the groups by a pulse that has a same period and a same duty ratio for every laser diode in the group.

3. The light source device according to claim 1, wherein an electrical power for driving each said group is set based on the predetermined period and the predetermined duty ratio.

4. The light source device according to claim 1, wherein an electrical power for driving each said group is set based on total electrical power consumption and a total illumination value of each said group.

5. The light source device according to claim 1, wherein the pulse driving section sets the number of the groups based on an operating limit current value of the laser diodes.

6. A projection apparatus comprising:
   a light source section which comprises plural laser diodes;
   a pulse driving section which divides the laser diodes of the light source section into plural groups, each group having the same number of the laser diodes, and drives the laser diodes of each said group by a pulse having a predetermined period and a predetermined duty ratio;
   a light source driving section which controls a phase of the pulse for each said group so that pulses corresponding to different groups are phase-shifted with respect to each other, and so that the same number of the laser diodes, which is less than a total number of the laser diodes, emit light in succession when the laser diodes in the plurality of groups are driven by the pulse driving section;
   an input section configured to input an image signal; and
   a projection section configured to use light source light emitted by the light source section and to form and project a color optical image corresponding to the image signal input through the input section.

7. The projection apparatus according to claim 6, wherein the pulse driving section drives each laser diode in a given one of the groups by a pulse that has a same period and a same duty ratio for every laser diode in the group.

8. The projection apparatus according to claim 6, wherein an electrical power for driving each said group is set based on the predetermined period and the predetermined duty ratio.

9. The projection apparatus according to claim 6, wherein an electrical power for driving each said group is set based on total electrical power consumption and a total illumination value of each said group.

10. The projection apparatus according to claim 6, wherein the pulse driving section sets the number of the groups based on an operating limit current value of the laser diodes.

11. A projection method for a projection apparatus including a light source section which comprises plural laser diodes, the method comprising:
   dividing the laser diodes of the light source section into plural groups, each group having the same number of the laser diodes;
   driving the laser diodes of each said group by a pulse having a predetermined period and a predetermined duty ratio; and controlling a phase of the pulse for each said group so that pulses corresponding to different groups are phase-shifted with respect to each other, and so that the same number of the laser diodes, which is less than a total number of the laser diodes, emit light in succession when the laser diodes in the plurality of groups are driven.

12. The light source device according to claim 1, wherein the laser diodes of the light source section all emit a same wavelength of light.

13. The light source device according to claim 12, wherein the laser diodes of the light source section all emit blue laser light of the same wavelength.

14. The projection apparatus according to claim 6, wherein the laser diodes of the light source section all emit a same wavelength of light.

15. The projection apparatus according to claim 14, wherein the laser diodes of the light source section all emit blue laser light of the same wavelength.

16. The projection method according to claim 11, wherein the laser diodes of the light source section all emit a same wavelength of light.

17. The projection method according to claim 16, wherein the laser diodes of the light source section all emit blue laser light of the same wavelength.

* * * * *